United States Patent
Farquhar et al.

(10) Patent No.: US 6,395,998 B1
(45) Date of Patent: May 28, 2002

(54) ELECTRONIC PACKAGE HAVING AN ADHESIVE RETAINING CAVITY

(75) Inventors: Donald S. Farquhar, Endicott; Gregory A. Kevern, Johnson City; Michael J. Klodowski, Endicott, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/661,652

(22) Filed: Sep. 13, 2000

(51) Int. Cl.[7] .............................. H05K 1/16; H05K 7/02
(52) U.S. Cl. ...................... 174/260; 174/252; 174/255; 174/259; 361/760; 361/707; 361/807; 257/706; 257/713; 257/783; 29/832
(58) Field of Search ................................. 174/260, 252, 174/255, 256, 261, 259, 52.1, 52.4; 361/760, 792, 704, 705, 707, 708, 709, 717, 718, 719, 720, 807, 808, 809; 257/713, 718, 783, 706, 707, 738; 29/832

(56) References Cited

U.S. PATENT DOCUMENTS

| | | | | |
|---|---|---|---|---|
| 4,635,093 A | * | 1/1987 | Ross ........................... 174/260 |
| 4,651,192 A | * | 3/1987 | Matsuhita et al. ........... 257/705 |
| 4,829,403 A | * | 5/1989 | Harding ....................... 361/704 |
| 5,013,871 A | * | 5/1991 | Mahulikar et al. .......... 174/52.4 |
| 5,026,624 A | | 6/1991 | Day et al. .................... 430/280 |
| 5,027,191 A | * | 6/1991 | Bourdelaise et al. ........ 257/735 |
| 5,070,596 A | | 12/1991 | Gaul et al. ..................... 29/620 |
| 5,185,550 A | | 2/1993 | Morita et al. ................ 310/344 |
| 5,218,234 A | | 6/1993 | Thompson et al. .......... 257/787 |
| 5,239,131 A | | 8/1993 | Hoffman et al. ............ 174/52.4 |
| 5,369,059 A | | 11/1994 | Eberlein ..................... 437/213 |
| 5,397,921 A | * | 3/1995 | Karnezos .................... 257/779 |
| 5,455,386 A | * | 10/1995 | Brathwaite et al. ........ 174/52.4 |
| 5,468,917 A | * | 11/1995 | Brodsky et al. ............. 174/255 |
| 5,530,278 A | | 6/1996 | Jedicka et al. ............... 257/432 |
| 5,557,150 A | | 9/1996 | Variot et al. ................. 257/787 |
| 5,558,267 A | | 9/1996 | Humphrey et al. .......... 228/4.5 |
| 5,723,899 A | | 3/1998 | Shin ............................ 257/666 |
| 5,767,447 A | | 6/1998 | Dudderar et al. ........... 174/52.4 |
| 5,798,909 A | | 8/1998 | Bhatt et al. .................. 361/764 |
| 5,808,873 A | | 9/1998 | Celaya et al. ............... 361/760 |
| 5,818,103 A | | 10/1998 | Harada ........................ 257/676 |
| 5,885,852 A | | 3/1999 | Kishikawa et al. .......... 458/117 |
| 5,920,037 A | | 7/1999 | Jimarez et al. .............. 174/259 |
| 6,201,300 B1 | * | 3/2001 | Tseng et al. ................. 257/705 |
| 6,281,573 B1 | * | 8/2001 | Atwood et al. .............. 257/706 |

* cited by examiner

*Primary Examiner*—Kamand Cuneo
*Assistant Examiner*—J B Patel
(74) *Attorney, Agent, or Firm*—Lawrence R. Fraley

(57) ABSTRACT

An electronic package and method of making the electronic package is provided. An opening in a thermally conductive member of the electronic package is formed to substantially prevent adhesive which can bleed from under a substrate mounted and secured on the thermally conductive member from contacting a portion of the thermally conductive member upon which an electrical element will be mounted.

23 Claims, 2 Drawing Sheets

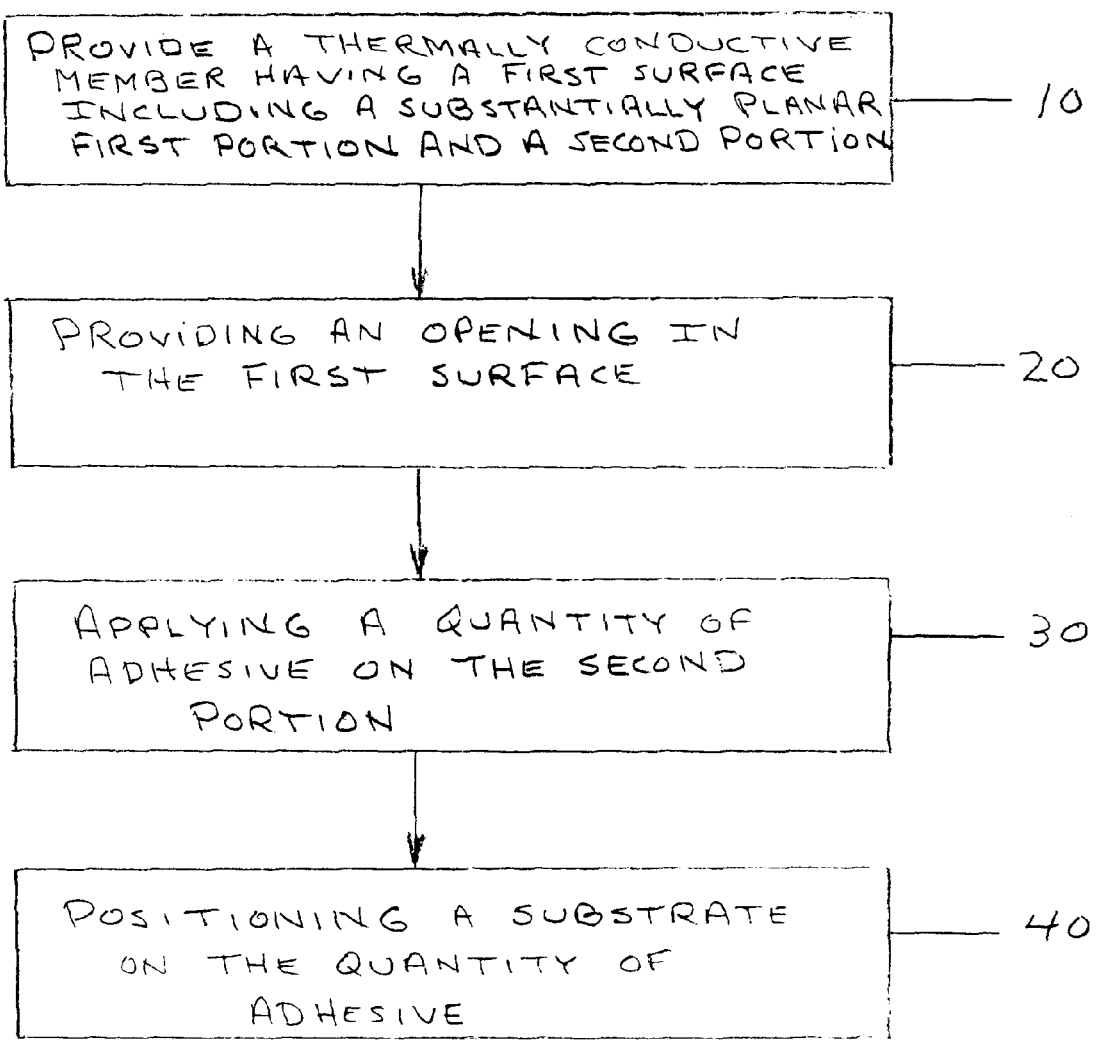

ELECTRONIC PACKAGE HAVING AN ADHESIVE RETAINING CAVITY

FIELD OF THE INVENTION

The present invention relates, in general, to an electronic package for mounting an electrical element, such as a transistor, amplifier, or semiconductor chip, including a structure having an opening therein for substantially preventing flow of a bonding adhesive onto an area adapted for mounting the electrical element.

BACKGROUND OF THE INVENTION

Many modern high power radio frequency or microwave applications require significant current carrying capability and/or significant thermal dissipation. To meet these needs, a thermally conductive member, such as thick metal backer (TMB) is often connected to an external ground plane located on the surface of a substrate, such as a printed circuit board (PCB), to improve the electrical performance of the ground plane and also to provide a heat sink for thermal dissipation. The TMB is essentially flat, but may contain a variety of holes and partial depth cavities for mounting various types of electrical elements, such as transistors, amplifiers, or semiconductor chips. These may or may not be hidden once the printed circuit card is attached. Methods for connecting such a TMB to the external ground plane of the PCB have included sweat soldering, non-conductive adhesive bonding followed by plating through holes for electrical interconnectivity, gold coating the ground plane and applying a silicone adhesive which includes a mixture of silver particles, or by mechanical interconnection such as screws, rivets or soldered pins. Each of these methods have proven less than ideal due primarily to relatively high costs.

Conductive bonding of the PCB to the TMB has cost and performance advantages, but achieving long term reliability of the conductive bond has been made more difficult because the TMB is typically made of aluminum. Aluminum does provide an excellent combination of weight, stiffness, machinability, electrical and thermal conductivity, and cost. However, the oxide that forms on the surface of aluminum results in relatively poor electrical conductivity when connected with electrically conductive adhesives, and poor stability in extended testing at elevated temperature and humidity has been observed. To overcome this problem, a more recent method, described in U.S. Pat. No. 5,920,037 "Conductive Bonding Design for Metal Backed Circuits", commonly assigned and incorporated by reference herein, meeting the current carrying and/or thermal dissipation needs required for microwave applications involves treating the surface of the TMB and then bonding the treated surface of the TMB to the back side of the PCB with a conductive adhesive. This method includes the steps of preparing a bonding surface of the TMB by micro-roughening the bonding surface. A conductive adhesive is screened onto the TMB at a thickness of about 0.003 inches (3 mils). The back side of the PCB is placed onto the conductive adhesive on the TMB and a roller is rolled across the PCB to insure intimate contact and wetting of the PCB with the adhesive. This electronic package assembly formed by joining the TMB with the PCB is then placed under pressure in a clamping fixture with pressure exerted at about 1 pound per square inch (psi). The electronic package contained within the fixture is placed in a conveyorized IR (infrared) oven for curing. After curing, the electronic package is removed from the clamping fixture.

While the micro-roughening method improves the adhesive to TMB interface strength, the low pressure, typically about 1 psi., used during the conductive adhesive joining and curing processes may not be sufficient to result in a void free bond line. This is principally due to pockets of air that are trapped in the bondline after the PCB is positioned on the TMB. The lamination pressure of 1 psi. is insufficient to force air from the bondline. For instance, the backside of the PCB may be comprised of bare dielectric material in some places, but have circuit features that are as much as 2 mils above the dielectric. Moreover, a 2 mil protective coating of solder mask such as PSR-4000 (PSR-4000 is a registered trademark of Taiyo America Inc., 2675 Antler Drive, Carson City, Nev.) or solder mask as described in U.S. Pat. No. 5,026,624 "Composition for Foil Imaging", commonly assigned and incorporated by reference herein, may also be present in selected areas on the backside of the PCB, including areas where there are circuit features. The resulting topography in this example may therefore be as much as 4 mils above the backside surface of the PCB. Thus, in the particular example when the surface topography of the PCB is comparable to the bondline thickness (3 mils) of the adhesive, voids in the adhesive bondline are possible when using known methods.

Prior attempts to overcome this problem of voiding due to surface topography have not been satisfactory. For example, the use of higher pressure during the process of laminating the PCB results in excessive squeeze out (bleed) and flow of the adhesive. If the edge bleed is significant, this adhesive flow can damage the assembly by contaminating surface features adapted for subsequent use as amplifier, transistor or semiconductor chip attachment pads. As another alternative, the use of a vacuum bagging technique to provide good conformance of the PCB to the TMB has been attempted, but also results in excessive bleed of the adhesive. In another approach, a thicker layer of adhesive is used, but even lower pressure is then required to prevent excess bleed. Moreover, this approach is undesirable because of the higher cost of the adhesive, and the increase in electrical resistance associated with a thicker bondline.

Previously, it was found that partially curing a conductive adhesive after the adhesive has been screened onto a TMB, but before attaching the PCB, can reduce the formation of trapped air and voids. This partial curing of the adhesive along with putting the PCB/TMB assembly under high pressure allowed a thinner bond line to be screened onto the TMB than the topography of the PCB. Even though partial curing the adhesive reduced the amount of bleed, there is still enough bleed to cause electrical connection problems under some circumstances, thus resulting in yield problems in the manufacturing process to assemble electrical elements to the TMB.

The present invention is directed at overcoming the problems set forth above. It is desirable to have an electronic package and method to make the electronic package that will substantially prevent adhesive that bleeds from under the PCB from contacting surface features adapted for subsequent use as amplifier, transistor or semiconductor chip attachment pads. Electronic packages produced by this method will have increased yield, lower cost, and improved operational life, since electrical elements can be bonded to surface features without the presence of conductive adhesive.

SUMMARY OF THE INVENTION

Accordingly, it is an object of this invention to enhance the art of packaging technology.

It is another object of this invention to provide a novel method for producing an electronic package that substantially prevents adhesive that may bleed from under a substrate bonded to a thermally conductive member from contacting a substantially planar first portion on a surface of the thermally conductive member of the electronic package.

It is yet another object of this invention to provide an electronic package that will be manufactured with increased yields and can be produced at relatively lower costs than many current products.

Still another object of this invention is to provide an electronic package adapted for having an electrical element or the like positioned on a substantially planar first portion of a surface of a thermally conductive member. The package substantially prevents adhesive that may bleed from under a substrate bonded to the thermally conductive member from contacting the substantially planar first portion on the surface of the thermally conductive member, resulting in a package having much improved operational field life.

According to one aspect of this invention, there is provided an electronic package, comprising a thermally conductive member having a first surface and an opening located therein, the opening including at least one side wall and a bottom wall. The first surface of the thermally conductive member includes a substantially planar first portion adapted for having an electrical element or the like positioned thereon and a second portion. The electronic package further includes a quantity of adhesive positioned on the second portion of the first surface of the thermally conductive member relative to the opening, and a substrate positioned on the quantity of adhesive. The adhesive securely holds the substrate in position on the thermally conductive member, and the opening substantially prevents the adhesive from contacting the substantially planar first portion of the first surface prior to positioning of the electrical element on the substantially planar first portion.

According to another aspect of the invention there is provided a method of making an electronic package comprising the steps of providing a thermally conductive member having a first surface including a substantially planar first portion adapted for having an electrical element or the like positioned thereon and a second portion, and providing an opening within the first surface, the opening having at least one side wall and a bottom wall. The method also includes applying a quantity of adhesive on the second portion of the first surface of the thermally conductive member relative to the opening. The method further includes positioning a substrate on the quantity of adhesive, the adhesive securely holding the substrate in position on the thermally conductive member, the opening substantially preventing the adhesive from contacting the substantially planar first portion of the first surface prior to positioning of the electrical element on the substantially planar first portion.

The above objects, advantages, and features of the present invention will become more readily apparent from the following detailed description of the presently preferred embodiments as illustrated in the accompanying drawings.

BRIEF DESCRIPTION OF THE DRAWINGS

FIG. 2 is a flow diagram of the steps carried out in making an electronic package, in accordance with one embodiment of the present invention.

BEST MODE FOR CARRYING OUT THE INVENTION

Figure 1:
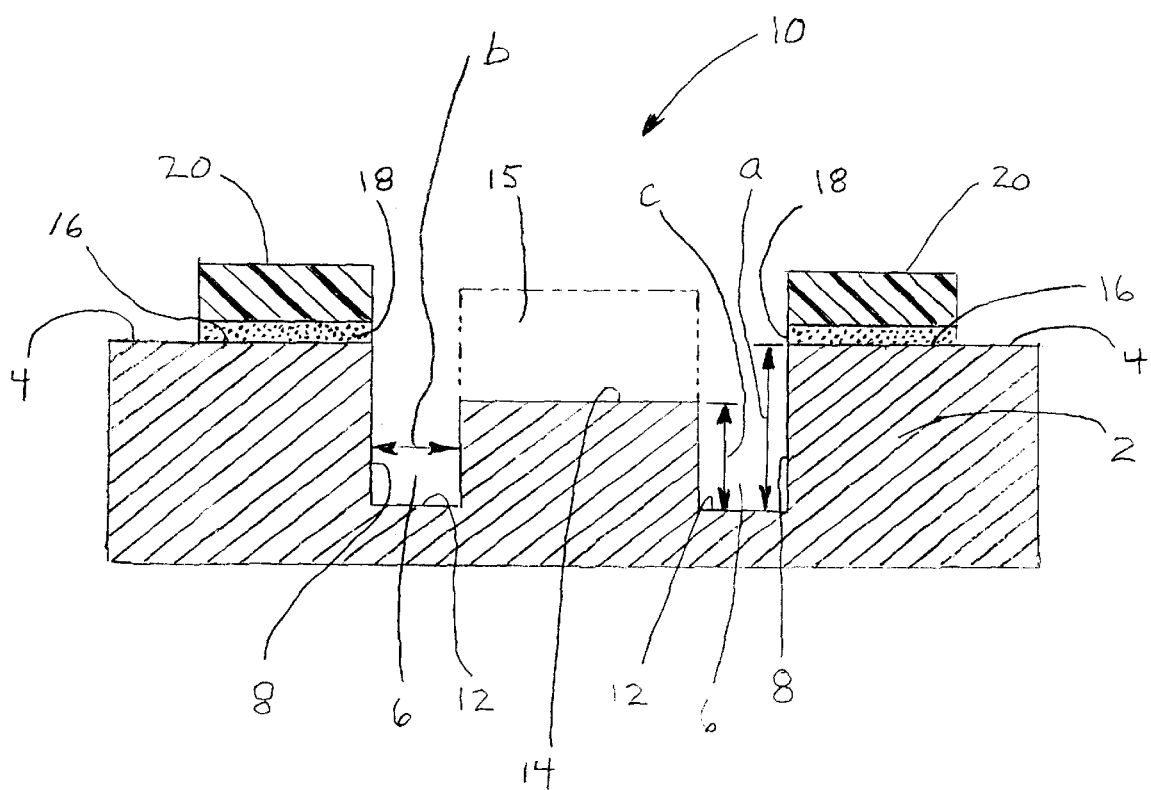
FIG. 1 is a sectional view in elevation of one embodiment of the electronic package of the present invention, illustrating a substrate assembled to a thermally conductive member, the thermally conductive member having an opening located therein, the opening having a side wall and a bottom wall.

An electronic package 10 embodying the present invention is shown in FIG. 1. The electronic package 10 includes a thermally conductive member 2 with a first surface 4. First surface 4 has an opening 6 located therein, the opening including at least one side wall 8 and a bottom wall 12. First surface 4 also includes a substantially planar first portion 14 adapted for having an electrical element 15 (shown in phantom) or the like positioned thereon. As seen in FIG. 1, electrical element 15 is positioned directly on substantially planar first portion 14, there being no die mount pad between the electrical element and the planar first portion. Electrical element 15 can be a transistor, amplifier or a semiconductor chip. First surface 4 further includes a second portion 16. A quantity of adhesive 18 is positioned on second portion 16 of first surface 4 relative to opening 6. The electronic package 10 includes a substrate 20 positioned on adhesive 18 to hold the substrate in position on thermally conductive member 2. Opening 6 substantially prevents adhesive 18 from contacting substantially planar first portion 14 prior to positioning electrical element 15 on the substantially planar first portion.

Thermally conductive member 2 may be comprised of a material selected from the group consisting of copper, aluminum, titanium, steel, and alloys thereof. Preferably, the thermally conductive member is comprised of an aluminum alloy, designated as 6061-T6. Alloy 6061-T6 can be obtained from Weldaloy Products Co., Warren, Mich. Thermally conductive member 2, when connected to substrate 20, functions as a heat sink and an electrical ground providing electrical shielding for the substrate.

The opening 6 in first surface 4 of thermally conductive member 2 comprises the shape of a polygon or a circle. For example, in this embodiment of the invention of electronic package 10, the shape of opening 6 is a rectangle. The sidewall 8 of rectangular opening 6 has a depth a, and bottom wall 12, a width b. Substantially planar first portion 14 positioned within the opening 6 is positioned at a distance c from bottom wall 12. It is important for yield, performance and reliability reasons that substantially planar first portion 14 be free of contaminants that might affect adhesion between electrical element 15 and the substantially planar first portion.

The invention includes a quantity of adhesive 18 that can be screened onto second portion 16 of thermally conductive member 2 at a thickness of at least about 0.5 mils to about 2.5 mils. Preferably, the thickness of adhesive 18 is about 1.5 mils. A wide variety of adhesives can be used. For example, the adhesive can be electrically conductive. These adhesives include, but are not limited to, isotropically conductive epoxies such as highly loaded silver-flake filled epoxies, for example Ablestik 8175 from Ablestik Laboratories, Rancho Dominguez, Calif. or Aremco-Bond 556, available from Aremco Products, Inc., Valley Cottage, N.Y. Other epoxy adhesives that can be used are anisotropically conductive epoxies, for example, epoxies loaded with silver plated nickel particles, silver or gold glass spheres or thermoplastic-based conductive adhesives. Another adhesive that can be used is Aremco-Bond 805, which is a thermally conductive, aluminum filled, two-part epoxy paste.

Adhesive 18 can be screened onto second portion 16 of thermally conductive member 2 in a low viscosity "wet" stage. After application on thermally conductive member 2, adhesive 18 is partially cured or "b-staged." The "b-staging"

of adhesive 18 partially cures the adhesive and therefore increases its viscosity. Thus, the subsequent flow upon application of heat and pressure of adhesive 18 is reduced. When substrate 20 is placed into contact with the adhesive and subjected to heat or pressure, adhesive bleed or squeeze-out is reduced.

"B-staging" partially advances the curing of adhesive 18 to an intermediate degree. The amount of cure can be characterized by physical properties including viscosity, molecular weight, cross-link density, shear modulus and glass transition temperature. As the amount of cure increases, all of these properties also increase. When a thermoset adhesive is cured molecules react with other molecules to ultimately form chains or networks of molecules. When the system is fully reacted, so that a continuous network of molecules is formed, it is considered substantially fully cured. However, when adhesive 18 is only partially cross-linked, the system is only partially cured or "b-staged."This "b-staging" process can be accomplished by application of heat or by exposure to actinic radiation if thermoset adhesive 18 is photo-sensitive. Upon subsequent heating, the system may be rendered substantially fully cured.

Once adhesive 18 is partially cured, substrate 20 is positioned on second portion 16 of thermally conductive member 2 and secured to the second portion by adhesive 18. Substrate 20 is comprised of a material selected from the group consisting of organic and ceramic materials. If an organic substrate is desired the organic material is selected from the group consisting of epoxy resin, epoxy glass, polyimide and polytetrafluoroethylene. In this embodiment, the substrate is a printed circuit board. The thermally conductive/adhesive/substrate assembly is substantially fully cured in a flat bed lamination press at about 50 to about 200 psi. at a cure temperature of about 100 degrees Celsius to 200 degrees Celsius. Preferably, the cure temperature is about 130 degrees Celsius to about 160 degrees Celsius with optimal results achieved at about 150 degrees Celsius. Time to substantially fully cure adhesive 18 is about 10 minutes to about 60 minutes. In one example, process parameters used were about 150 degrees Celsius for about 40 minutes at about 75 psi. By performing "b-staging" before substantially fully curing adhesive 18, the flow of the adhesive is limited and undesirable affects such as bleed and squeeze-out are reduced. Even if some topography exists on the PCB, such as circuit lines or solder mask, the adhesive will conform and fill effectively around these features because a higher lamination pressure may be used due to the higher viscosity of the b-staged adhesive. If there is a protective coating or solder mask on some of the circuitry, it will also tend to soften and deform, further accommodating the surface topography. The use of higher pressure allows for a thinner bondline in which the higher lamination pressure eliminates voiding throughout the bondline between the PCB and the TMB. This is particularly beneficial because of the economic benefit of using less adhesive. While better bondline performance is achieved with this process, adhesive 18 will none the less tend to flow or bleed from areas of high pressure to low pressure, resulting in an undesirable condition.

Importantly, in electronic package 10, embodying the present invention, opening 6 in thermally conductive member 2 substantially surrounds substantially planar first portion 14. As such, this opening prevents adhesive 18 from contacting substantially planar first portion 14 on thermally conductive member 2, improving the interface between electrical element 15 to substantially planar first portion 14.

The size and shape of opening 6 is dependent on the amount and location of adhesive bleed that occurs during "b-staging" and final curing of adhesive 18. To substantially prevent bleed the sum of depth a, width b and distance c should be at least about 50 mils.

FIG. 2 illustrates the various steps involved in making an electronic package according to one aspect of the present invention. A thermally conductive member is provided, as depicted in Block 10, the thermally conductive member having a first surface and a substantially planar first portion adapted for having an electrical element or the like positioned thereon and a second portion. The step of providing the thermally conductive member further comprises the step of micro-roughening the first surface. Micro-roughening can be performed by vapor blasting the first surface. Vapor blasting can be defined as spraying, under pressure, a fine grit abrasive suspended in a medium or solvent onto a surface using a spray processing tool. One medium that can be used is water.

As depicted in Block 20, an opening is then provided in the first surface, the opening having at least one side wall and a bottom wall. The opening in the first surface can be provided by a process of milling, grinding, chemical etching, electro-chemical machining, stamping or molding.

Block 30 describes the step of applying a quantity of adhesive on the second portion of the first surface of the thermally conductive member relative to the opening. The application of the quantity of adhesive can be performed by screening, however other techniques of applying adhesives to surfaces, known to those of ordinary skill in the art, can also be used. After screening, the quantify of adhesive on the second portion is "b-staged" or partially cured from about 30 minutes to about 60 minutes at about 100 degrees Celsius to about 150 degrees Celsius.

Block 40 describes the step of positioning a substrate on the quantity of adhesive, the adhesive securedly holding the substrate in position on the thermally conductive member, the opening substantially preventing the adhesive from contacting the substantially planar first portion of the first surface prior to positioning of the electrical element on the substantially planar first portion. After securing the substrate, the quantity of adhesive is substantially fully cured. Pressure can be applied in a lamination press or by any means that can impart pressure to the assembly.

In summary, the defined package structures and methods of forming same provide an electronic package that is more reliable in operating field life and has lower defect levels in manufacturing, because the adhesive used to mount the substrate on the thermally conductive member is substantially prevented from contacting the first portion of the thermally conductive member on which an electrical element is to be mounted. This is uniquely accomplished by providing a thermally conductive member with a quantity of adhesive positioned thereon, upon which a substrate is mounted and secured. The thermally conductive member includes an opening that substantially prevents adhesive, which bleeds from under the substrate during lamination or curing, from contacting the first portion of the thermally conductive member onto which the electrical element is to be bonded. The product made with the unique teachings described herein, will have lower defect levels, increased yields, lower cost, and improved operational field life.

While there have been shown and described what are the present considered preferred embodiments of the invention, it will be obvious to those skilled in the art that various changes and modifications may be made therein without departing from the scope of the invention as defined by the appended claims.

We claim:

1. An electronic package comprising:
   a thermally conductive member having a first surface and an opening located therein, said opening having at least one side wall and a bottom wall, said first surface of said thermally conductive member including a substantially planar first portion adapted for having an electrical element or the like positioned thereon and a second portion;
   a quantity of adhesive positioned on said second portion of said first surface of said thermally conductive member relative to said opening; and
   a substrate positioned on said quantity of adhesive, said adhesive securedly holding said substrate in position on said thermally conductive member, said opening substantially preventing said adhesive from contacting said substantially planar first portion of said first surface prior to positioning of said electrical element on said substantially planar first portion.

2. The electronic package of claim 1 wherein said thermally conductive member is comprised of a material selected from the group consisting of copper, aluminum, titanium, steel, and alloys thereof.

3. The electronic package of claim 1 wherein said thermally conductive member comprises an electrical shield.

4. The electronic package of claim 1 wherein said opening is comprised of a substantially circular or polygonal shape.

5. The electronic package of claim 4 wherein said polygonal shape comprises a rectangle.

6. The electronic package of claim 5 wherein said side wall has a predetermined depth.

7. The electronic package of claim 6 wherein said bottom wall has a predetermined width.

8. The electronic package of claim 7 wherein said substantially planar first portion is positioned within said opening in said first surface and spacedly positioned at a predetermined distance from said bottom wall of said opening.

9. The electronic package of claim 8 wherein said predetermined depth, width, and distance comprise a total of at least about 50 mils.

10. The electronic package of claim 1 wherein said electrical element comprises a transistor, an amplifier, or an integrated circuit chip.

11. The electronic package of claim 1 wherein said adhesive comprises an epoxy adhesive.

12. The electronic package of claim 11 wherein said epoxy adhesive is electrically conductive.

13. The electronic package of claim 1 wherein said substrate is comprised of a material selected from the group consisting of organic and ceramic materials.

14. The electronic package of claim 13 wherein said substrate is an organic material and is selected from the group consisting of epoxy resin, epoxy glass, polyimide, and polytetrafluoroethylene.

15. An electronic package comprising:
   a thermally conductive member having a first surface and an opening located therein, said opening having at least one side wall and a bottom wall, said first surface of said thermally conductive member including a substantially planar first portion and a second portion;
   an electrical element or the like positioned directly on said substantially planar first portion;
   a quantity of adhesive positioned on said second portion of said first surface of said thermally conductive member relative to said opening; and
   a substrate positioned on said quantity of adhesive, said adhesive securedly holding said substrate in position on said thermally conductive member, said opening substantially preventing said adhesive from contacting said substantially planar first portion of said first surface prior to positioning of said electrical element on said substantially planar first portion.

16. A method of making an electronic package comprising the steps of:
   providing a thermally conductive member having a first surface including a substantially planar first portion adapted for having an electrical element or the like positioned thereon and a second portion;
   providing an opening within said first surface, said opening having at least one side wall and a bottom wall;
   applying a quantity of adhesive on said second portion of said first surface of said thermally conductive member relative to said opening; and
   positioning a substrate on said quantity of adhesive, said adhesive securedly holding said substrate in position on said thermally conductive member, said opening substantially preventing said adhesive from contacting said substantially planar first portion of said first surface prior to positioning of said electrical element on said substantially planar first portion.

17. The method of claim 16 wherein said step of providing said thermally conductive member having said first surface further comprises the step of micro-roughening said first surface.

18. The method of claim 16 wherein said step of providing said opening within said first surface comprises the step of milling, grinding, chemical etching, electro-chemical machining, stamping, or molding.

19. The method of claim 16 wherein said step of applying said quantity of adhesive on said second portion of said first surface of said thermally conductive member comprises screening.

20. The method of claim 19 further including the step of partially curing said quantity of adhesive after said applying said quantity of adhesive on said second portion of said first surface of said thermally conductive member.

21. The method of claim 20 wherein said partially curing said quantity of adhesive comprises heating said quantity of adhesive from about 100 degrees Celsius to about 150 degrees Celsius for about 30 minutes to about 60 minutes.

22. The method of claim 20 further including the step of substantially fully curing said quantity of adhesive after said step of partially curing said quantity of adhesive.

23. The method of claim 22 wherein said substantially fully curing said quantity of adhesive comprises heating said quantity of adhesive from about 100 degrees Celsius to about 200 degrees Celsius and applying pressure onto said adhesive of from about 50 pounds per square inch to about 200 pounds per square inch for about 10 minutes to about 60 minutes.

* * * * *